(12) United States Patent
Trimberger (10) Patent No.: US 8,536,896 B1
(45) Date of Patent: Sep. 17, 2013

(54) PROGRAMMABLE INTERCONNECT ELEMENT AND METHOD OF IMPLEMENTING A PROGRAMMABLE INTERCONNECT ELEMENT

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/484,598

(22) Filed: May 31, 2012

(51) Int. Cl.
*H03K 19/177* (2006.01)

(52) U.S. Cl.
USPC .............................. 326/38; 326/41

(58) Field of Classification Search
USPC ................................ 326/37–41, 46
See application file for complete search history.

(56) References Cited

U.S. PATENT DOCUMENTS

| | | | |
|---|---|---|---|
| 5,208,491 A | 5/1993 | Ebeling et al. |
| 5,367,209 A | 11/1994 | Hauck et al. |
| 5,426,378 A | 6/1995 | Ong |
| 5,583,450 A | 12/1996 | Trimberger et al. |
| 5,600,263 A | 2/1997 | Trimberger et al. |
| 5,629,637 A | 5/1997 | Trimberger et al. |
| 5,646,545 A | 7/1997 | Trimberger et al. |
| 5,701,441 A | 12/1997 | Trimberger |
| 5,761,483 A | 6/1998 | Trimberger |
| 5,778,439 A | 7/1998 | Trimberger |
| 5,784,313 A | 7/1998 | Trimberger et al. |
| 5,825,662 A | 10/1998 | Trimberger |
| 5,838,954 A | 11/1998 | Trimberger |
| 5,959,881 A | 9/1999 | Trimberger et al. |
| 5,978,260 A | 11/1999 | Trimberger et al. |
| 6,263,430 B1 | 7/2001 | Trimberger et al. |
| 6,480,954 B2 | 11/2002 | Trimberger et al. |
| 6,829,756 B1 | 12/2004 | Trimberger |
| 7,047,509 B1 | 5/2006 | Trimberger |
| 7,138,827 B1 | 11/2006 | Trimberger |
| 7,268,581 B1 | 9/2007 | Trimberger et al. |
| 7,521,959 B2 * | 4/2009 | Teig ................................ 326/38 |
| 7,605,604 B1 | 10/2009 | Young |
| 7,635,989 B1 | 12/2009 | Young |
| 7,743,175 B1 | 6/2010 | Young |
| 7,746,113 B1 | 6/2010 | Young |
| 7,759,974 B1 | 7/2010 | Young |

OTHER PUBLICATIONS

U.S. Appl. No. 12/896,718, filed Oct. 1, 2010, Kaviani.
U.S. Appl. No. 12/896,742, filed Oct. 1, 2010, Kaviani.
U.S. Appl. No. 12/896,720, filed Oct. 1, 2010, Kaviani.
Borriello, Geotano et al., "The Triptych FPGA Architecture," *IEEE Transactions on VLSI Systems*, Dec. 1995, pp. 473-482, vol. 3, No. 4, IEEE, IEEE, Piscataway, New Jersey, USA.
Hauser, John R. et al., "Garp: A MIPS Processor with Reconfigurable Coprocessor," *Proc. of the 5th Annual IEEE Symposium on Field-Programmable Custom Computing Machines*, Apr. 16, 1997, pp. 24-33, IEEE, Piscataway, New Jersey, USA.
Tsu, William et al., "HSRA: High-Speed, Hierachical Synchronous Reconfigurable Array," *Proc. of the 1999 ACM/SIGDA 7th International Symposium on Field Programmable Gate Arrays*, pp. 125-134, ACM, New York, New York, USA.

\* cited by examiner

*Primary Examiner* — Don Le
(74) *Attorney, Agent, or Firm* — John J. King (57) ABSTRACT

A programmable interconnect element for an integrated circuit device is described. The programmable interconnect comprises a first selection circuit coupled to a plurality of input lines and having a first output; a register having a first input coupled to the first output; and a second selection circuit enabling the selection of a value at the first output or a value stored by the register. A method of implementing a programmable interconnect element is also disclosed.

16 Claims, 10 Drawing Sheets

PROGRAMMABLE INTERCONNECT ELEMENT AND METHOD OF IMPLEMENTING A PROGRAMMABLE INTERCONNECT ELEMENT

FIELD OF THE INVENTION

The present invention relates generally to integrated circuits, and in particular, to a programmable interconnect element and a method of implementing a programmable interconnect element.

BACKGROUND

Integrated circuits are important elements of many electronic devices. In order for an electronic system to operate faster, it is necessary that integrated circuits implemented in a device or the system operate faster. The speed of an integrated circuit is often defined in terms of a clock speed, or the frequency of the clock signal used to operate the integrated circuit. In order for an integrated circuit to operate at a faster clock speed, it is necessary that the various circuits of the integrated circuit are able to operate at the faster clock speed.

The length of interconnects, which are metal traces between elements of an integrated circuit, is one factor which affects the speed of an integrated circuit. Long-distance interconnects make it difficult to implement integrated circuits or systems at a high clock rate. More particularly, in integrated circuits having interconnect elements which are circuit-switched, a dedicated, non-registered connection is made for each interconnect in the integrated circuit. These interconnects may take a long time to settle if they extend a long distance, leading to a reduced clock speed. While there may be ways to improve the speed of integrated circuits, there are numerous drawbacks to conventional circuits associated with interconnects that improve the speed of an integrated circuit.

SUMMARY

A programmable interconnect element for an integrated circuit device is described. The programmable interconnect comprises a first selection circuit coupled to a plurality of input lines and having a first output; a register having a first input coupled to the first output; and a second selection circuit enabling the selection of a value at the first output or a value stored by the register.

According to an alternate embodiment, the first selection circuit may comprise a first multiplexer, and the second selection circuit may comprise a second multiplexer. The second multiplexer may be coupled to receive both a registered output at an output of the register and an unregistered output at the first output of the first multiplexer. Alternatively, the second multiplexer may be coupled to the first output of the first multiplexer at a first input and may be coupled to receive an input signal at a second input. The programmable interconnect element may further comprise a third multiplexer, wherein an output of the third multiplexer is coupled to an input of the second multiplexer. The register may comprise a latch and the second selection circuit comprises a signal generator, the latch being operable in a transparent state and a hold state in response to a control signal received at the second input.

According to an alternate embodiment, a programmable interconnect element comprises a first multiplexer having a plurality of input lines and a first output; a second multiplexer coupled to the plurality of input lines of the first multiplexer and having a second output; a third multiplexer having a first input coupled to the first output of the first multiplexer and a second input coupled the second output of the second multiplexer, and having a third output; and a first register having a first input coupled to the third output of the third multiplexer and a second input coupled to receive a first control signal, wherein a second control signal is provided to a control terminal of the third multiplexer in a time-multiplexing mode and a third control signal is provided to the third multiplexer in a pipelining mode.

According to other embodiments, a control terminal of the third multiplexer is held fixed or allowed to float in the pipelining mode. Further, the control terminal of the third multiplexer is coupled to receive a first clock signal in the time-multiplexing mode, wherein the first control signal may be the first clock signal. The programmable interconnect element may further comprise a fourth multiplexer coupled to the output of the first register, the fourth multiplexer enabling the selection of the third output of the third multiplexer or the output of the first register. The programmable interconnect element may further comprise a second register coupled to the output of the third multiplexer, wherein a first phase of a demultiplexed signal is stored in a first register a second phase of the demultiplexed signal is stored in a second register. An output of the programmable interconnect element may be coupled to an input of another programmable interconnect element.

A method of implementing a programmable interconnect element is also disclosed. The method comprises coupling a first multiplexer to a plurality of input lines, the first multiplexer having a first output; coupling the first output to an input of a register; and enabling a selection of a value at the first output of the first multiplexer or a value stored by the register.

The method may further comprise selecting a value at an input line of the plurality of input lines using the first multiplexer. Enabling a selection of a value at the first output of the first multiplexer or a value stored by the register may comprise coupling the first output of the first multiplexer and an output of the register to a multiplexer. Enabling a selection of a value at the first output of the first multiplexer or a value stored by the register may comprise operating the register as a transparent latch. Enabling a selection of a value at the first output of the first multiplexer or a value stored by the register comprises controlling the register with a clock signal. The method may further comprise generating a time-multiplexed output of the programmable interconnect element in a first mode and a pipelined output of the programmable interconnect element in a second mode.

DETAILED DESCRIPTION

Figure 1:
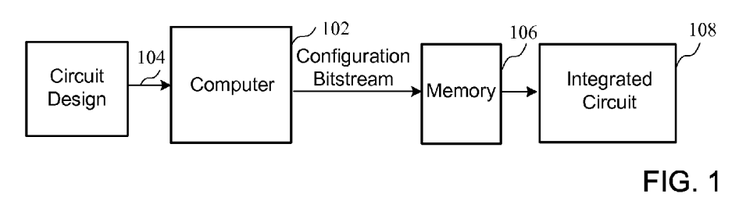
FIG. 1 is a block diagram for a system for implementing an integrated circuit having programmable resources according to an embodiment.

Turning first to FIG. 1, a block diagram for a system for implementing integrated circuits having programmable resources is shown. In particular, a computer 102 is coupled to receive a circuit design 104, and generate a configuration bitstream. The computer 102 may include a design tool for generating the configuration bitstream. An example of a design tool which could be implemented by the computer 102 is the ISE or Vivado design tool available from Xilinx, Inc., of San Jose, Calif. The configuration bitstream may be stored in a memory 106, from which it is downloaded to an integrated circuit 108. As will be described in more detail below, the integrated circuit 108 includes programmable resources which are configured based upon the configuration bitstream.

While programmable resources according to the various embodiments may be implemented in any type of integrated circuit device, such as an application specific integrated circuit (ASIC) having programmable resources, other devices generally referred to as programmable logic devices (PLDs) include a significant portion of programmable resources. A PLD is an integrated circuit designed to be user-programmable so that users may implement logic designs of their choices. One type of PLD is the Complex Programmable Logic Device (CPLD). A CPLD includes two or more "function blocks" connected together and to I/O resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a variety of programmable routing resources. These CLBs, IOBs, and programmable routing resources are customized by loading a configuration bitstream into configuration memory cells of the FPGA. However, it should be understood that the programmable resources implemented in CPLDs or FPGAs may be implemented in a portion of an ASIC.

For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell. As will be described in more detail below, the configuration bitstream enables configuring circuit elements for asynchronous communication in an integrated circuit, such as an integrated circuit having programmable resources.

Figure 2:
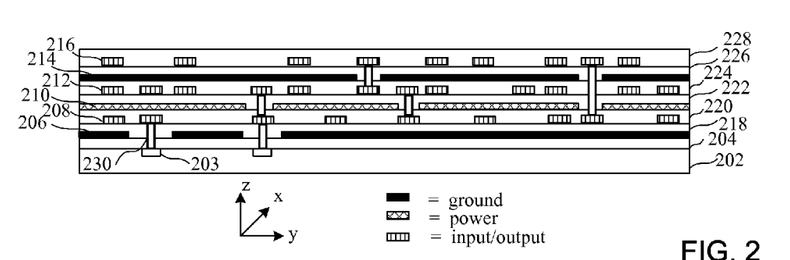
FIG. 2 is a cross-sectional view of an integrated circuit having programmable resources according to an embodiment.

Turning now to FIG. 2, a cross-sectional view of an integrated circuit according to an embodiment is shown. The cross-sectional view of FIG. 2 shows various metal layers, shown here with shading or hatching. The metal layers are built over a substrate 202 in the "z" direction according to the axial directions as shown, and are separated by insulating layers. More particularly, the substrate 202 includes circuit elements 203. The circuit elements may be passive devices such as resistors or capacitors, or active devices, such as transistors, for example. As should be apparent in the remaining description, the circuit blocks are implemented in the substrate and coupled by configurable routing resources. Referring to the particular embodiment of FIG. 2, the substrate is covered by a dielectric layer 204. Metal layers and dielectric layers are then alternately applied. As shown in FIG. 2, a plurality of metal layers 206-216 is separated by corresponding dielectric layers 218-226. A dielectric layer 228 covers the top metal layer 226. Vias 230 enable connections between various metal layers or to circuit elements implemented in the substrate, as is well known in the art.

As is shown in FIG. 2, metal layers 206, 210 and 214 include lines which extend in the "y" direction, while metal layers 208, 212 and 216 include lines which extend in the "x" direction. The various conductors implemented in the various metal layers may be power conductors, ground conductors or signaling conductors. While the cross section of FIG. 2 shows particular conductors in various layers, additional metal layers may be implemented, and the arrangement of conductors may be different. For example, multiple signals may be provided by power, ground and signaling conductors in a given layer. Further, some layers may be implemented as power or ground planes.

The exemplary layers of FIG. 2 are provided by way of example to show how different layers may be used to provide different types of interconnects between circuit elements of the integrated circuit. According to one embodiment, certain metal layers may be implemented for interconnects extending predetermined distances between circuit elements of the integrated circuit. For example, various metal layers may be implemented to enable electrical connections between various circuit blocks which are separated by a predetermined number of circuit blocks, and may be considered long lines. In contrast, other layers may be implemented to enable electrical connections between a fewer number of circuit blocks. The length of such lines would generally be shorter, and therefore would be considered short lines. Some metal layers may also be used for local interconnects, which provides connections of elements within a given circuit block. Circuits for enabling the input/output of data and the routing of the data within an integrated circuit are described in detail in reference to FIGS. 3-5.

Figure 3:
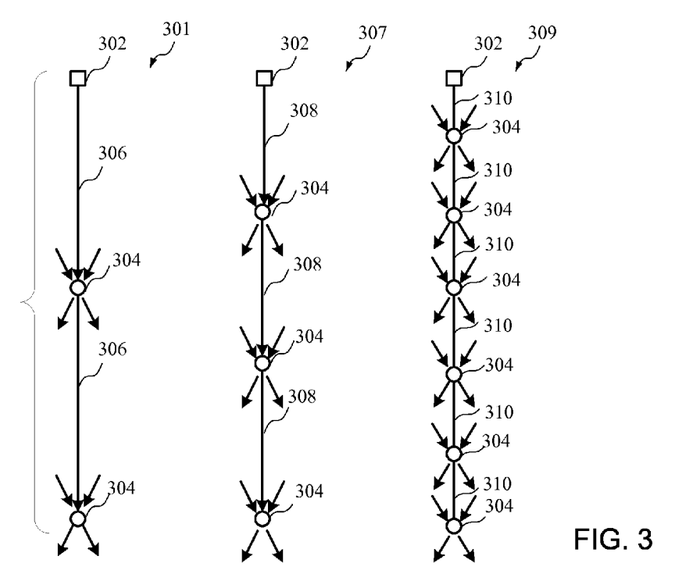
FIG. 3 is a plan view of programmable interconnects according to an embodiment.

Turning now to FIG. 3, a plan view of conductors of routing resources having interconnects according to an embodiment is shown. In particular, portions of three different types of interconnects having programmable interconnect elements extend across the same number of elements, such as circuit blocks, of an integrated circuit. As described above, each of these three programmable interconnects may be implemented on different metal layers, but are shown together in FIG. 3 to provide a general relationship between the different interconnect lengths. The different types of interconnects having programmable interconnect points are shown to indicate not only that some of the types of interconnects have different functions, but that they may also be implemented with different circuits, as will be described in more detail below.

A first exemplary programmable interconnect 301 includes an input/output port 302 and programmable interconnect elements 304 which couple interconnects 306. According to the embodiment of FIG. 3, the interconnects 306 are referred to as "hex" interconnects because they have a length which extends across 6 circuit elements of the circuit, such as 6 configurable logic elements. The interconnects 306 may also be referred to as "long lines." An input/output port 302 is shown in each of the programmable interconnects of FIG. 3 by way of example as an interconnect point at an end of an integrated circuit. However, it should be understood that portions of the programmable interconnect circuits shown in FIG. 3 implemented away from an end of the integrated circuit would include programmable interconnect points rather than input/ output ports on either side of an interconnect.

A second exemplary programmable interconnect 307 includes an input/output port 302 and four programmable interconnect elements 304 which are used to connect interconnects 308. The interconnects 308 are referred to as "quad" interconnects, where each quad interconnect may extend across four circuit elements of the circuit. Finally, a third exemplary programmable interconnect 309 includes an input/ output ports 302 and five programmable interconnect elements 304. The interconnects 310 are referred to as "double" interconnects, where each double interconnect extends across two circuit elements of the circuit. However, as can be seen, each portion of a programmable interconnect 301, 307 and 309 shown in FIG. 3 would extend across twelve circuit elements. While the programmable interconnect elements 304 included in FIG. 3 show the connection of an input from one interconnect and an output to another interconnect, it will be understood that the programmable interconnect elements 304 enable the routing of a signal from multiple inputs, as will be described in more detail in reference to FIG. 5. Further, it should be understood that other arrangements of programmable interconnects could be employed.

Figures 4, 5:
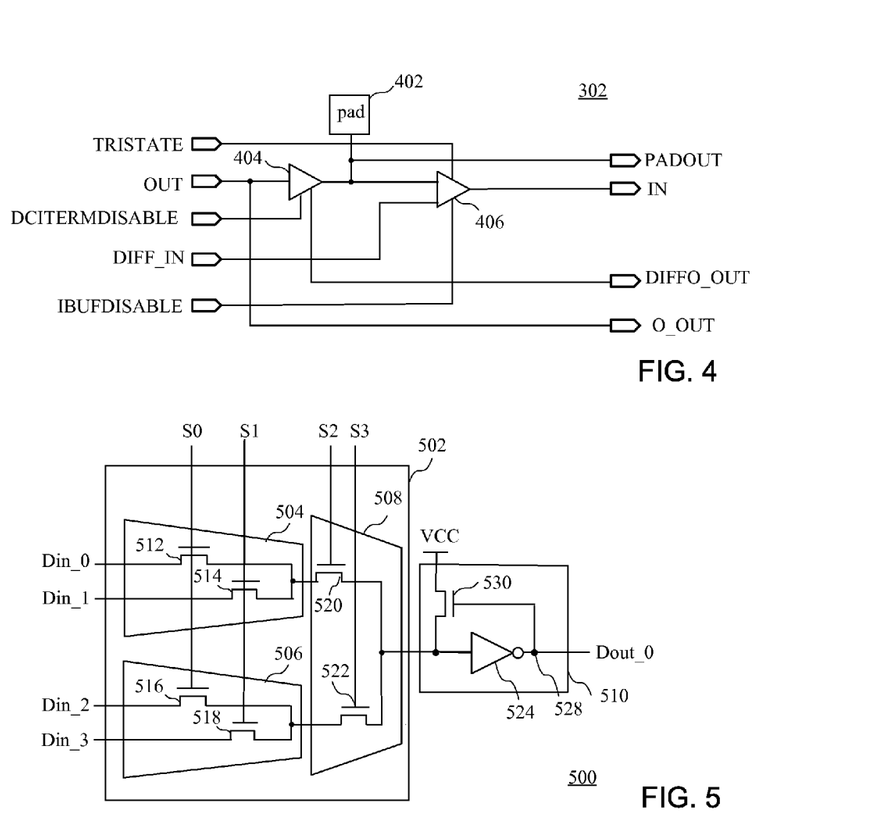
FIG. 4 is a block diagram of an input/output (I/O) port according to an embodiment.
FIG. 5 is a block diagram of a programmable interconnect element having according to an embodiment.

Before describing the programmable interconnect elements according to various embodiments, a block diagram of an I/O port as shown in FIG. 4 will be described. The I/O port 302 includes an I/O pad 402 coupled to the output of an output buffer 404 and to the input of an input buffer 406. The output buffer 404 receives an output signal (OUT) that is coupled by the output buffer 404 to the I/O pad 402, and a digitally-controlled impedance termination disable (DCITERMDIS-ABLE) signal that controls the impedance of the output buffer 404. In addition to a PADOUT signal generated directly to the I/O pad 402, an input signal (IN) is also generated at the output of the input buffer 406. The I/O port according to the embodiment of FIG. 4 can route differential signals. The input buffer 406 is coupled to receive a second input (DIFF_IN), and is controlled by an input buffer disable (IBUFDIS-ABLE) signal. Further, a differential output (DIFFO_OUT) signal is generated in addition to an output signal (O_OUT) based upon to the input of the output buffer 404. A tristate control (TRISTATE) signal is also coupled to control the input buffer 406. While the circuit of FIG. 4 shows one example of an I/O port that may be implemented, it should be understood that other I/O ports or variations of the I/O port of FIG. 4 may be implemented.

Turning now to FIG. 5, a programmable interconnect element 500 according to an embodiment is shown. The programmable interconnect element 500, as well as other programmable interconnect elements, may be implemented as the programmable interconnect element 304, for example. The programmable interconnect element 500 includes a multiplexer 502 having multiplexing elements 504 and 506 in a first stage, and a multiplexing element 508 receiving the outputs of the multiplexing elements 504 and 506 in a second stage. The output of the multiplexer 502 is coupled to the buffer 510.

The multiplexing element 504 comprises first and second pass transistors 512 and 514 receiving data input signals Din_0 and Din_1, respectively, and are controlled by select inputs S0 and S1, respectively. Similarly, multiplexing element 506 comprises first and second pass transistors 516 and 518 receiving data input signals Din_2 and Din_3, respectively, and are also controlled by select inputs S0 and S1, respectively. The output of the multiplexing element 504 is coupled to a fifth pass transistor 520 of the multiplexing element 508, and the output of the multiplexing element 506 is coupled to a sixth pass transistor 522. The fifth pass transistor 520 is controlled by a select signal S2 and the sixth pass transistor 522 is controlled by a select signal S3.

The output buffer 510 may comprise a half latch comprising inverter-524 coupled in series at a node 528 which is coupled to a gate of a transistor 530. While only a single inverter 524 is shown, it should be understood that another inverter would be implemented in an uneven number of interconnect elements are used. Accordingly, the programmable interconnect element 500 enables the transfer of input data from one of a number of inputs to an output as output data Dout_0. The multiplexer 502 of FIG. 5, which is a four-to-one multiplexer, is shown by way of example. However, it should be understood that other circuits could be implemented for selecting an input signal. As will be described in more detail in reference to other embodiments, selected input signals may be optionally registered to improve the speed of the integrated circuit.

Figure 6:
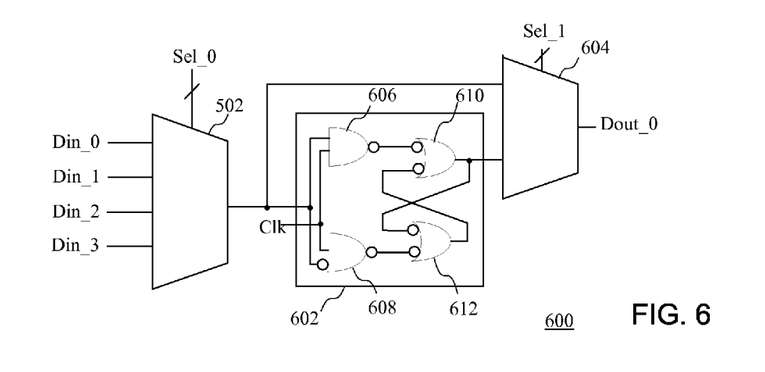
FIG. 6 is a block diagram of a programmable interconnect element enabling the selection of a registered input value according to an embodiment.

Turning now to FIG. 6, a block diagram of a programmable interconnect element 600 enabling the selection of a registered input value is shown. According to the embodiment of FIG. 6, the output of the multiplexer 502 is coupled to a register 602 and a first input of a multiplexer 604. The multiplexer 604 receives the output of the register 602 at a second input. Register 602 comprises a first NAND gate 606 and a second NAND gate 608 which are each coupled to receive a control signal, shown here as a clock signal (Clk) at a first input. A register is a device which stores a value, such as a bit of data. An output of the multiplexer 502 is coupled to a second input of the NAND gate 606 and an inverted input of the NAND gate 608. The outputs of the NAND gates 606 and 608 are coupled to inverted inputs of cross-coupled OR gates 610 and 612. Each of the OR gates 610 and 612 is coupled to the output of the other at a second inverted input. The select signal Sel_1 is used to select either the output of the multiplexer 502 or a registered value output by register 602 as an output Dout_0 in response to the Clk signal. While the register 602 is shown by way of example, it should be understood that other circuit arrangements for implementing a register could be employed, including a full master-slave flip flop, a level-sensitive latch a pulsed latch or other storage element. Storage may be static or dynamic.

Unlike the programmable interconnect element 500 of FIG. 5, the programmable interconnect element 600 of FIG. 6 enables optionally selecting a registered output value of the multiplexer 502. That is, the data coupled to the first input of the multiplexer 604 is an unregistered output value of the multiplexer 502. The data coupled to the second input of the multiplexer 604 (i.e., the output of register 604) is a registered output value of the multiplexer 502. As will be described in more detail below, a register according to the various embodiments of a programmable interconnect element may be implemented as a transparent latch or a master/slave flip flop or other storage circuit. While adding registers to interconnect elements of an integrated circuit adds area and delay, the additional registers improve performance. For example, by implementing the programmable interconnect element 600 at various locations of an integrated circuit, a higher clock speed can be implemented in the integrated circuit by selectively including registers in interconnect lines to improve the clock rate.

Excessive registering of signals causes multiple clock cycles of delay, which may lead to slower overall circuits. Those pipelined signals must be aligned at their destinations as well. The additional area and delay provided by a register 602 may unnecessarily decrease area and power efficiency of an integrated circuit if the register is not needed in some of the programmable interconnect elements. Accordingly, programmable interconnect elements which optionally register output values of a multiplexer may be selectively implemented to provide an efficient integrated circuit architecture. That is, only some of the interconnect elements, such as interconnect elements of long lines, may have programmable interconnect elements which register the inputs, while interconnect elements of shorter lines may be implemented as shown in FIG. 5. Further, as will be described in more detail below in reference to FIGS. 16-18, the registers may enable additional functionality, such as enabling multi-functional programmable interconnect elements which enable selectable time-multiplexing, pipelining, and circuit-switched functionality.

Figure 7:
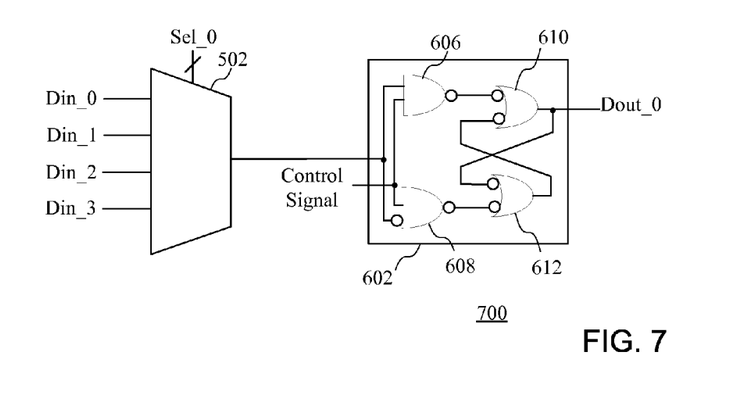
FIG. 7 is a block diagram of programmable interconnect element having a controllable register according to an embodiment.

The various embodiments set forth below, which provide programmable interconnect elements having registers, reduce area and delay overhead. In some of the embodiments, all of the inputs to the interconnect element may be registered, while others relate to an optionally-registered interconnect architecture where it is imperative that the additional registers have limited impact on the delay of non-registered inputs. As shown in the embodiment of FIG. 6, register 602 follows the routing multiplexer 502. The circuit of FIG. 6 is simple and compact, but it slows all signals through the interconnect element by the addition of another multiplexer stage which includes multiplexer 604. In order to eliminate the multiplexer stage, the register could be implemented as a latch without the following multiplexer according to some embodiments. In the embodiment of FIG. 7, for example, the programmable interconnect element 700 may be implemented without the multiplexer 602, where the register is held transparent in response to a control signal set to hold the register transparent (for example holding the control signal equal to logic 1) when implemented to provide non-registered outputs. The control signal may be generated or set by one of a variety of selection circuits. For example, the control signal may be a value stored in a memory element, such as a configuration memory element where the value is associated with a configuration bit downloaded to the integrated circuit, as will be described in more detail below in reference to FIGS. 19 and 20. The control signal may be the logical OR of a configuration memory cell and the clock signal. The control signal in a memory element may be changed during a partial configuration of the device. Accordingly to other embodiments, a selection circuit for implementing the control signal may be a configuration controller or other circuit required for configuring the integrated circuit. The control signal may also be provided by a control circuit, such as a processor of the integrated circuit. A selection circuit for providing the control signal to the register may be implemented in a variety of ways, such as a multiplexer or by using circuit elements such as a configuration memory element, a configuration circuit, or a processor, which will be described in more detail in reference to FIG. 19.

Figure 8:
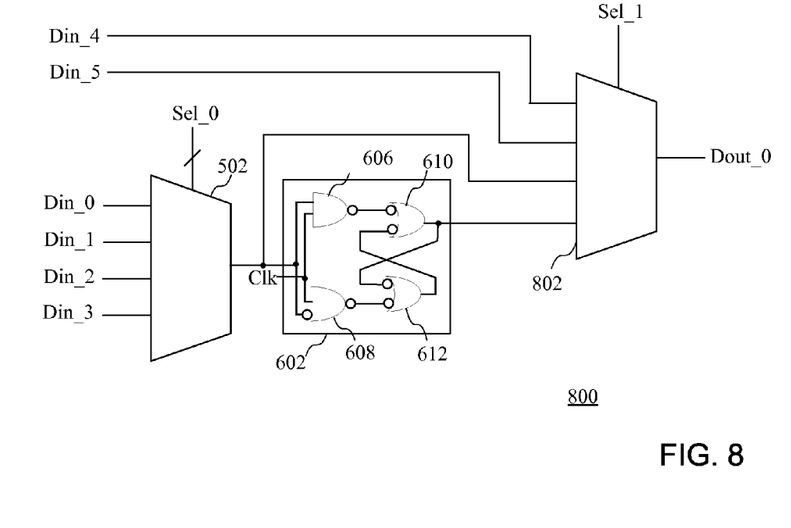
FIG. 8 is a block diagram of programmable interconnect element enabling the selection of separate unregistered input values according to an embodiment.
Figure 9:
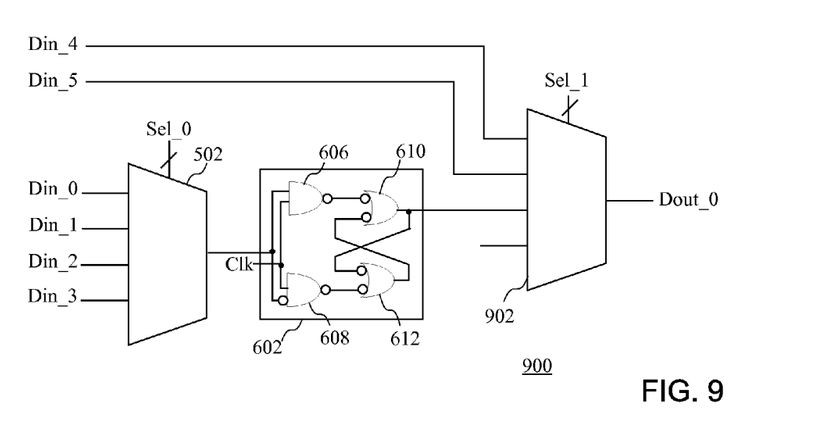
FIG. 9 is a block diagram of a programmable interconnect element enabling the selection of either a registered input value or an unregistered input value according to an embodiment.
Figure 10:
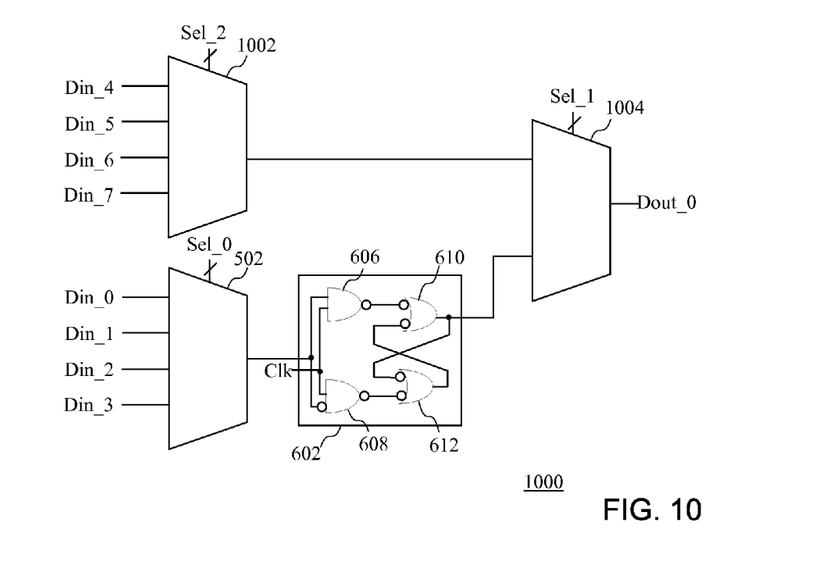
FIG. 10 is a block diagram of a programmable interconnect element enabling the selection of either a registered input value or an unregistered input value from an additional multiplexer according to an embodiment.
Figure 11:
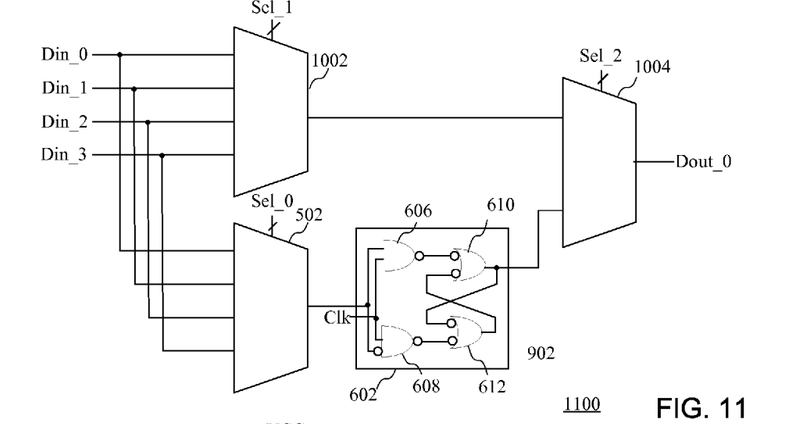
FIG. 11 is a block diagram of a programmable interconnect element enabling the selection of either a registered input value or an unregistered input value using multiplexers having common inputs according to an embodiment.

According to other embodiments, values at particular inputs may not be registered, where these non-registered input values are not slowed by a multiplexer. According to the embodiment of FIG. 8, the programmable interconnect element 800 includes a multiplexer 802 which, in addition to receiving the output of multiplexer 502 and the output of the register 602, is coupled to receive separate input signals, shown here as Din_4 and Din_5. In this embodiment, Din_4 and Din_5 can't be registered, but have low delay to Dout_0. As shown in the embodiment of FIG. 9, the programmable interconnect element 900 includes a multiplexer 902 which enables a subset of input signals (i.e., Din_0-Din_3) always to be registered. That is, an input value selected by multiplexer 502 will always be a registered input value which may be selected by multiplexer 902. This embodiment reduces the loading on the output of mux 502, improving the speed of the registered signals. According to the embodiment of FIG. 10, the programmable interconnect element 1000 may include a multiplexer 1002, where non-registered inputs values are separately multiplexed before being coupled to the multiplexer 1004. This embodiment reduces the size of multiplexer 1004, improving the clock to out delay of register 602. According to the embodiment of FIG. 11, the inputs to the multiplexers 502 and 1002 of the programmable interconnect element 1100 may be coupled together, wherein any of the input signals may be generated as either a non-registered value or a registered value. This embodiment reduces the delay of the non-registered signals.

Figure 12:
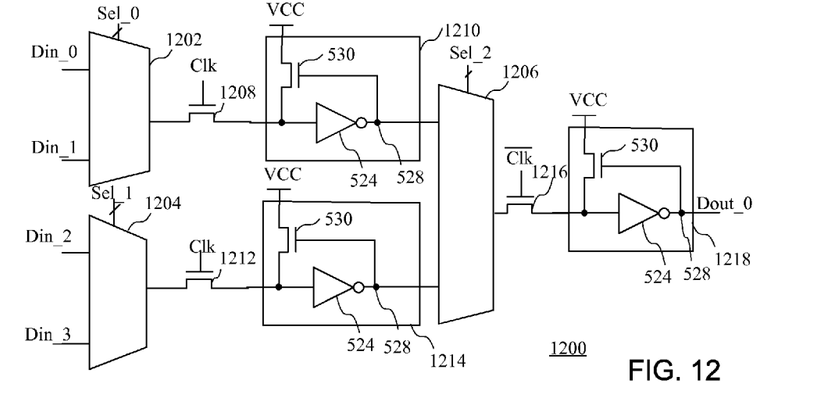
FIG. 12 is a block diagram of a programmable interconnect element having a dynamic latch in a multiplexer according to an embodiment.

Turning now to FIG. 12, a block diagram of a programmable interconnect element having dynamic latch in a multiplexer is shown. The dynamic latch may be smaller and faster than a static latch. Large multiplexers may be implemented as buffered, smaller multiplexers. Such smaller, buffered multiplexers comprise inverters between stages of a larger multiplexer. Accordingly, it is possible to build dynamic latches in the larger multiplexer by the addition of pass gates. According to the embodiment of FIG. 12, a first stage of multiplexers 1202 and 1204 are coupled to a second stage 1206 by pass gates and latches. In particular, a first pass gate 1208 is coupled between an output of multiplexer 1202 and a latch 1210, the output of which is coupled to a first input of the multiplexer 1206. A second pass gate 1212 is coupled between the output of the multiplexer 1204 and an input of a latch 1214, the output of which is coupled to a second input of the multiplexer 1206. A pass gate 1216 is coupled to a latch 1218 at the output of the multiplexer 1206 to generate Dout_0.

The latches 1210, 1214, and 1218 may be comprised of a half buffer 510 as shown in FIG. 5. The transistors of the pass gates are controlled by the Clk signal and the inverted Clk signal as shown to latch the selected input data signal of the input data signals Din_0-Din_3 as an output signal Dout_0. The inverted clock signal is coupled to the gate of transistor 1216 to prevent a race condition where data may be inadvertently captured at a next stage. The single pass transistors shown in FIG. 12 can be replaced by full CMOS transmission gates comprising NMOS and PMOS transistors coupled in parallel. To generate an output Dout_0 which is a non-registered value, both the Clk and inverted Clk signals would be held high. When implementing only a single stage, only the clock signal, and not the inverted clock signal, would be necessary. According to alternate embodiments, a full flip flop could be used in place of each of the latches 1210, 1214, and 1216. According to a further embodiment, the circuit of FIG. 12 can be implemented with static latches in place of the pass transistors, such as the static latches shown in FIGS. 14 and 15.

Figure 13:
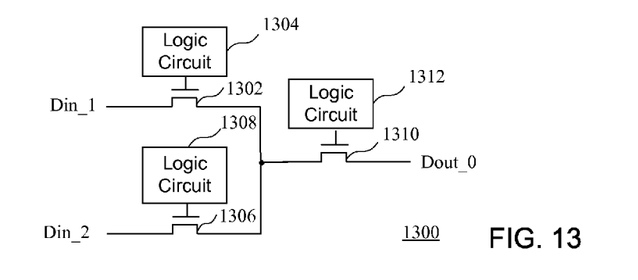
FIG. 13 is a block diagram of a programmable interconnect element having a combined multiplexer and dynamic latch according to an embodiment.

Turning now to FIG. 13, a block diagram of a programmable interconnect element having a combined multiplexer and dynamic latch is shown. In order to reduce the delay in the interconnect element, the clock can be combined with the select signal to generate a control signal for the pass gates coupled to the input signals. As shown in FIG. 13, a first pass transistor 1302 coupled to receive a first input signal IN1 is controlled by a logic circuit 1304, while a second pass transistor 1306 coupled to receive a second input signal IN2 is controlled by a logic circuit 1308. Unlike the embodiment of FIG. 12 where the transistors of the first and second stage multiplexers 1202-1206 require that additional transistors be placed between an input and the output, the logic circuits 1304, 1308, and 1312 generate the control signals to the gates of pass transistors 1302, 1306, and 1310, respectively, based upon a clock signal and control signals which would generate the select signals Sel_0 and Sel_1. In some embodiments, logic circuit 1304 generates an output signal of the form (M1*Sel0+M1'*Sel0*Clk) and logic circuit 1308 produces an output signal of the form (M1*Sel1+M1'*Sel1*Clk), where M1, Sel0 and Sel1 are configuration memory cells, and M1' is the inverted M1 signal. In some embodiments, the logic circuit 1312 produces an output signal of the form (M1+Clk'), where Clk' is the inverted Clk signal. Accordingly, the programmable interconnect element 1300 does not delay the non-registered signal, because the signal on the gate of the pass transistor is not changing. When an input signal is registered, there is additional clock-to-out delay on the logic circuit when the logic circuit and the pass transistor are functioning as a latch. It should be noted that when the pass transistors 1216 and 1310 are provided at the output of the embodiments of FIGS. 12 and 13, respectively, this functionality could be implemented in a flip flop at an output of a configurable logic block (CLB), which will be described in more detail in reference to FIG. 20. The single pass transistors shown in FIG. 13 can be replaced by full CMOS transmission gates comprising NMOS and PMOS transistors coupled in parallel.

Figure 14:
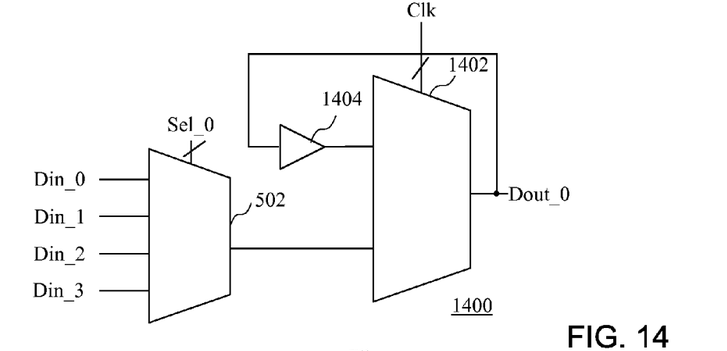
FIG. 14 is a block diagram of a programmable interconnect element having a static latch implemented in a multiplexer according to an embodiment.
Figure 15:
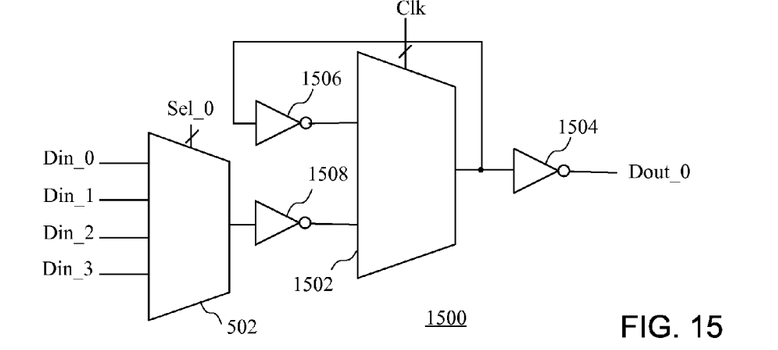
FIG. 15 is a block diagram of a programmable interconnect element having a static latch implemented in a multiplexer according to an alternate embodiment.

Turning now to FIG. 14, a block diagram of a programmable interconnect element 1400 having a static latch implemented in a multiplexer is shown. According to the embodiment of FIG. 14, the latch is implemented by buffering the selected output signal back into the output stage multiplexer which is gated with the clock signal. In particular, the output of the multiplexer 1402 is coupled back to a buffer 1404. Because the multiplexer 1402 is controlled by the clock signal, the selected output will be latched at every clock cycle. According to the embodiment of FIG. 15, invertors are used in a programmable interconnect element 1500. In particular, an inverter 1504 coupled to the output of a multiplexer 1502 is fed back to an inverter 1506. An inverter 1508 is also provided at the output of the multiplexer 502 in order to generate the correct output of the programmable interconnect element when the output of the inverter 1508 is selected by the multiplexer 1502.

Figure 16:
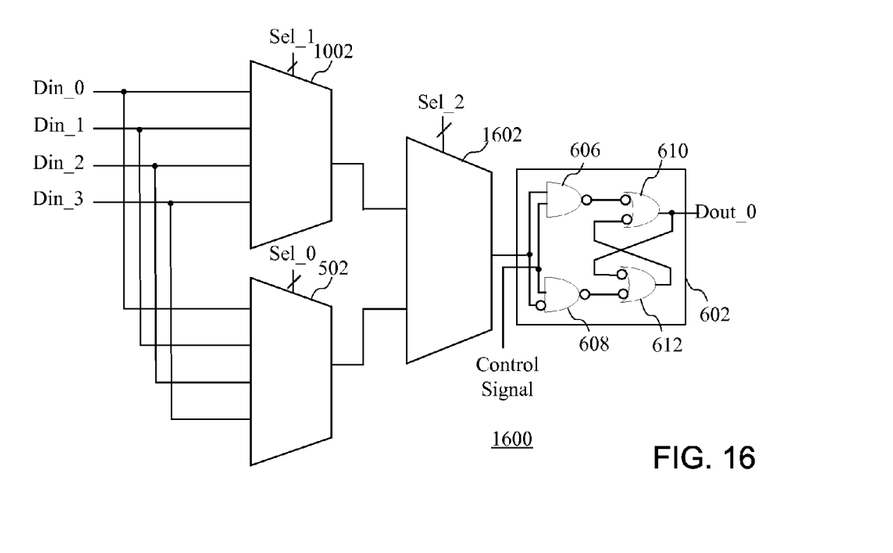
FIG. 16 is a block diagram of a multi-mode programmable interconnect element according to an embodiment.
Figure 17:
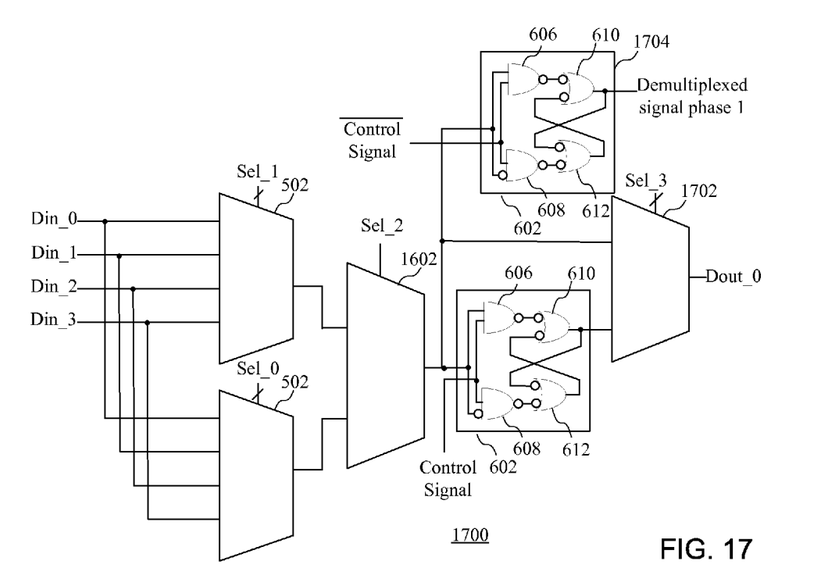
FIG. 17 is a block diagram of a multi-mode programmable interconnect element according to an alternate embodiment.
Figure 18:
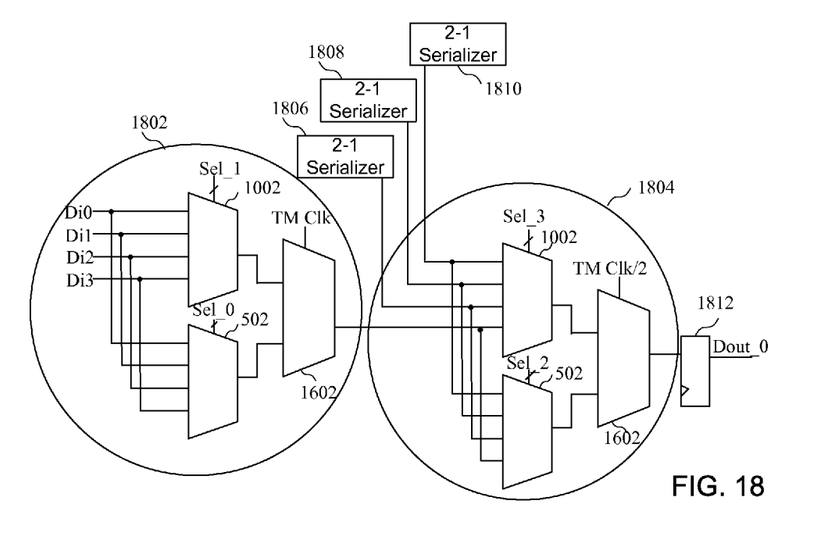
FIG. 18 is a block diagram showing a plurality of multi-mode programmable interconnect elements coupled together according to an embodiment.

While additional circuitry implemented in the programmable interconnect elements to enable registering inputs improves timing performance when routing signals in an integrated circuit, the additional circuitry adds area to the circuit. When the elements, such as registers, are not needed for timing performance, they become overhead that increases the area requirements and reduces the power efficiency. However, as set forth in FIGS. 16-18 below, the registers can be selectively used for different functions. More particularly, circuits of FIGS. 16-18 provide efficient combinations of routing multiplexers with registers for building registered, pipelined interconnects or time-multiplexed interconnects. Pipelining is the time multiplexing of two signals coming from the same input line. Registers implemented in the programmable interconnect elements can also be selectively used for time multiplexing if signals from two different lines are chosen. Some of the programmable interconnect elements set forth above in FIGS. 6-15 may be used to used to implement multi-mode programmable interconnect elements enabling both time multiplexing and pipelining as will be described in FIGS. 16-18.

Turning now to FIG. 16, a block diagram of a multi-mode programmable interconnect element is shown. A multiplexer 1602 is coupled between the outputs of multiplexers 502 and 1002 and the register 602 as configured in FIG. 11. By placing the multiplexer 1602 between the first stage multiplexers 502 and 1002 and the register 602, the register can be used for storing the output of the multiplexer 1602 so that data on different inputs can be time multiplexed, or data on the same input can be pipelined. When a clock signal is used as the select signal Sel_2 to alternately select the output of the multiplexers 502 and 1002, the registered interconnect outputs can be used for time multiplexing to effectively get twice as many bits transferred over the interconnect element. That is, the select signals Sel_1 and Sel_0 are used to select different input signals, which are alternately provided on the output of the multiplexer 1602 in response to the clock signal, designated as the time-multiplexing (TM) clock signal, implemented as the select signal Sel_2. Because the alternating rising and falling edges of the TM clock signal applied as the Sel_2 signal alternately selects data from multiplexer 502 and multiplexer 1002, the TM click signal would have the same frequency of the clock signal providing the input data (Din_0-Din_3). According to one embodiment, the control signal can be fixed to hold the register transparent. According to another embodiment, the output of multiplexer 1602 may be pipelined (even when the circuit of FIG. 16 is implemented in a time-multiplexing mode). When pipelining the output data of the multiplexer 1602, the pipelining clock signal applied as the control signal to the register will be at twice the frequency of the TM clock signal (or the clock signal for the input data). Accordingly, the multi-mode programmable interconnect element 1600 of FIG. 6 can be implemented as a time-multiplexing interconnect circuit, a pipelining interconnect circuit, or a circuit switched interconnect circuit.

In a time-multiplexing mode where the programmable interconnect element functions as a time-multiplexed serializer, multiplexer 1602 switches between two signals (e.g., Din_0 and Din_1) to be serialized onto the output as Dout_0. The serialized data may be pipelined, as set forth above.

According to the embodiment of FIG. 17, the multi-mode programmable interconnect element may be implemented as a time-multiplexed de-serializer. When deserializing, the multiplexed data is received on one of the Din_0-Din_3 lines, and the select signals Sel_0-Sel_2 are used to select that line. The TM clock signal is provided as the control signal of the register 602 to hold one data value of the time-multiplexed signal on the selected line at the output of the register 602 (which is selected by the multiplexer 1702), while the other data value of the time-multiplexed signal on the selected signal line is the output of a second register 1704 (which is controlled by the inverted control signal). Therefore, the phase 1 of the demultiplexed signal may be generated at the output of the register 1704, while phase 2 of the demultiplexed signal would be the selected output of register 602 generated as Dout_0. Accordingly, the register 602, which would otherwise be used for pipelining in the interconnect network, may be used for time multiplexing when deserializing data on a single line. The frequency of the TM clock signal applied as the control signal to the register 602 would be half as fast as the clock signal providing the data Din_0-Din_3 to the multiplexer 502 and 1002 (i.e., the clock signal of the corresponding circuit that multiplexes the data that is being de-multiplexed by the circuit in FIG. 17). That is, because the output of the multiplexer 1602 would be alternately latched by the control signal and the inverted control signal, the clock rate of the control signal would be half of the clock rate of the data Din_0-Din_3. It should be noted that if the circuit of FIG. 17 is only used for de-serializing, only a single multiplexer of the multiplexers 502 and 1002 would be required.

If multiplexer 1002 is selected to provide data (i.e., when deserializing data from a single line, the Sel_2 signal of the multiplexer 1602 can be held high to select the output of multiplexer 1002. The multiplexer 502 can then be used for other functions, such as selecting a clock signal or providing a selection input signal to the multiplexer 1702. Accordingly, in some embodiments the register 602 will need to be implemented to function as a flip flop for pipeline mode, and latch in tirne-multiplexed mode.

It should be noted that only one clock is necessary for both time-multiplexing and pipelining functions if the integrated circuit (or the region of the integrated circuit) supports only one mode (i.e., a time-multiplexing mode or a pipelining mode) at a time. That is, in the pipelining mode, the selection signal for multiplexer 1602 of FIG. 16 is held constant, where each successive pulse of the clock signal coupled as a control signal to the register 602 accepts the next data value. In the time-multiplexing mode, the phase of the clock coupled to the control signal of the multiplexer 1602 selects the signal on the line. However, if time multiplexed data is pipelined as set forth above, two clock signals will be required.

The embodiment of FIGS. 16 and 17 may also operate in a conventional circuit-switched (CS) mode. That is, while the programmable interconnect elements having the capability to register data provide benefits as set forth above, there may be situations when it is desirable for a programmable interconnect element to operate in a circuit switched mode, where data is allowed to pass through the programmable interconnect elements between registers coupled to the programmable interconnect elements. Accordingly, the select signals Sel_0-Sel_2 select an input, and a non-registered output is provided at the output of multiplexer 1602 of FIG. 16 or multiplexer 1702 of FIG. 17. Accordingly, the multimode programmable interconnect elements 1600 of FIGS. 16 and 1700 of FIG. 17 can be implemented as a time-multiplexing element, a pipelining element, or a circuit switched element.

Turning now to FIG. 18, a block diagram showing a plurality of multi-mode programmable interconnect elements coupled together is shown. Serializers can be cascaded to make a 4:1 serializer, for example. As shown in FIG. 18, the output of a first multi-mode programmable serializer element 1802 (for example, the programmable interconnect element 1600 in FIG. 16) is coupled to an input of a second multi-mode programmable serializer element 1804. Other multi-mode programmable serializer elements 1806-1810 may be coupled to the multiplexer 1002 of the second multi-mode programmable interconnect element 1804. The cascaded 2:1 serializers implemented in multi-mode programmable serializer elements 1802 and 1804 enables generating a 4:1 serializer.

Figure 19:
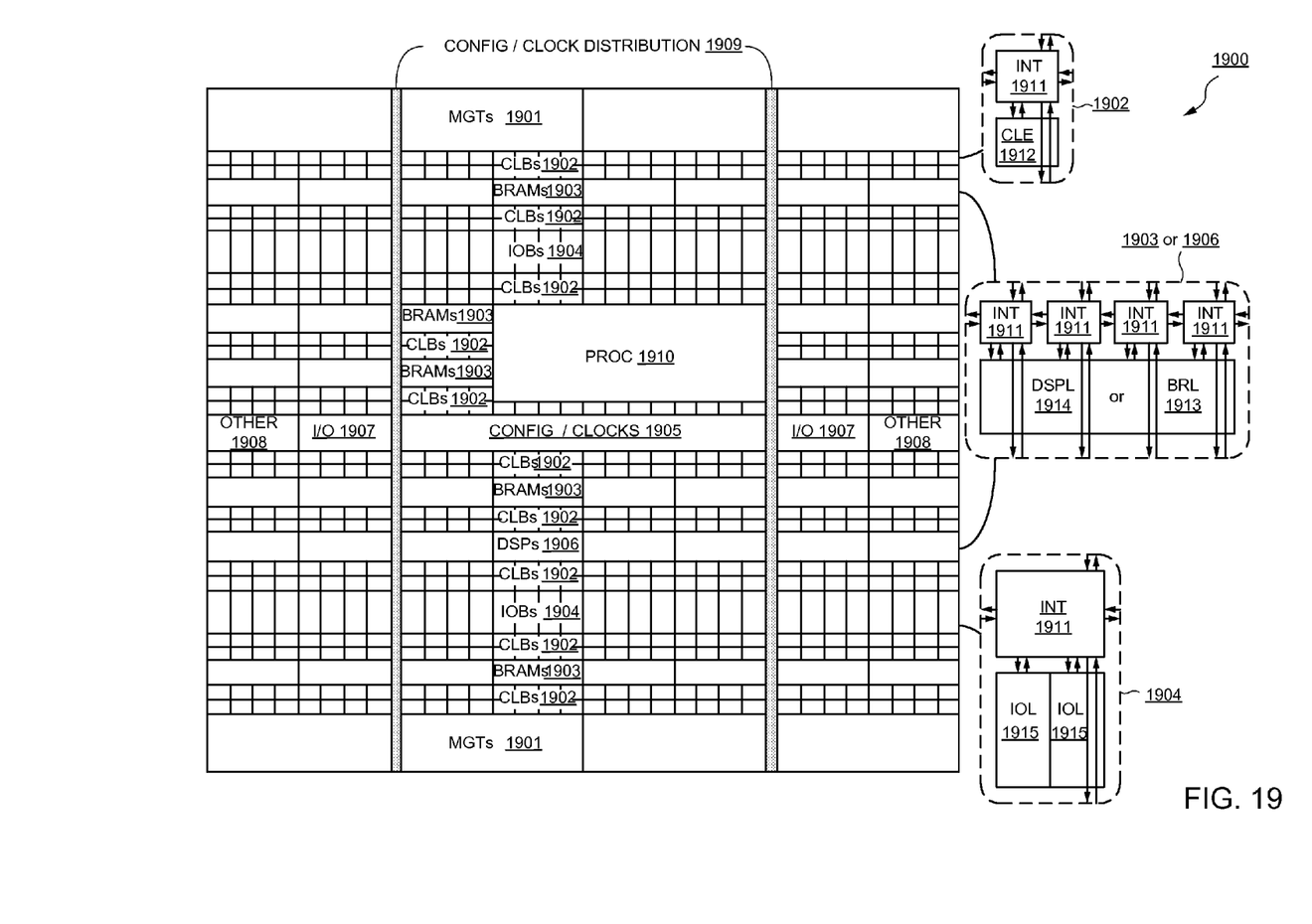
FIG. 19 is a block diagram of an integrated circuit having programmable resources according to an embodiment.

Turning now to FIG. 19, a block diagram of an integrated circuit having programmable resources according to an embodiment is shown. The device of FIG. 19 comprises an FPGA architecture 1900 having a large number of different programmable tiles including multi-gigabit transceivers (MGTs) 1901, CLBs 1902, random access memory blocks (BRAMs) 1903, input/output blocks (IOBs) 1904, configuration and clocking logic (CONFIG/CLOCKS) 1905, digital signal processing blocks (DSPs) 1906, specialized input/output blocks (I/O) 1907 (e.g., configuration ports and clock ports), and other programmable logic 1908 such as digital clock managers, analog-to-digital converters, system monitoring logic, and so forth. Some FPGAs also include dedicated processor blocks (PROC) 1910, which may be used to implement a software application, for example.

In some FPGAs, each programmable tile includes a programmable interconnect element (INT) 1911 having standardized connections to and from a corresponding interconnect element in each adjacent tile. Therefore, the programmable interconnect elements taken together implement the programmable interconnect structure for the illustrated FPGA. The programmable interconnect element 1911 also includes the connections to and from the programmable logic element within the same tile, as shown by the examples included at the top of FIG. 19.

For example, a CLB 1902 may include a configurable logic element (CLE) 1912 that may be programmed to implement user logic plus a single programmable interconnect element 1911. A BRAM 1903 may include a BRAM logic element (BRL) 1913 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1906 may include a DSP logic element (DSPL) 1914 in addition to an appropriate number of programmable interconnect elements. An IOB 1904 may include, for example, two instances of an input/output logic element (IOL) 1915 in addition to one instance of the programmable interconnect element 1911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 1909 extending from this column are used to distribute the clocks and configuration signals across the breadth of the FPGA. Some FPGAs utilizing the architecture illustrated in FIG. 19 include additional logic blocks that disrupt the regular columnar structure making up a large part of the FPGA. The additional logic blocks may be programmable blocks and/or dedicated logic. For example, the processor block PROC 1910 shown in FIG. 19 spans several columns of CLBs and BRAMs.

Note that FIG. 19 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 19 are purely exemplary. For example, in an actual FPGA more than one adjacent column of CLBs is typically included wherever the CLBs appear in order to facilitate the efficient implementation of user logic. While the embodiment of FIG. 19 relates to an integrated circuit having programmable resources, it should be understood that the circuits and methods set forth in more detail below could be implemented in any type of ASIC.

Figure 20:
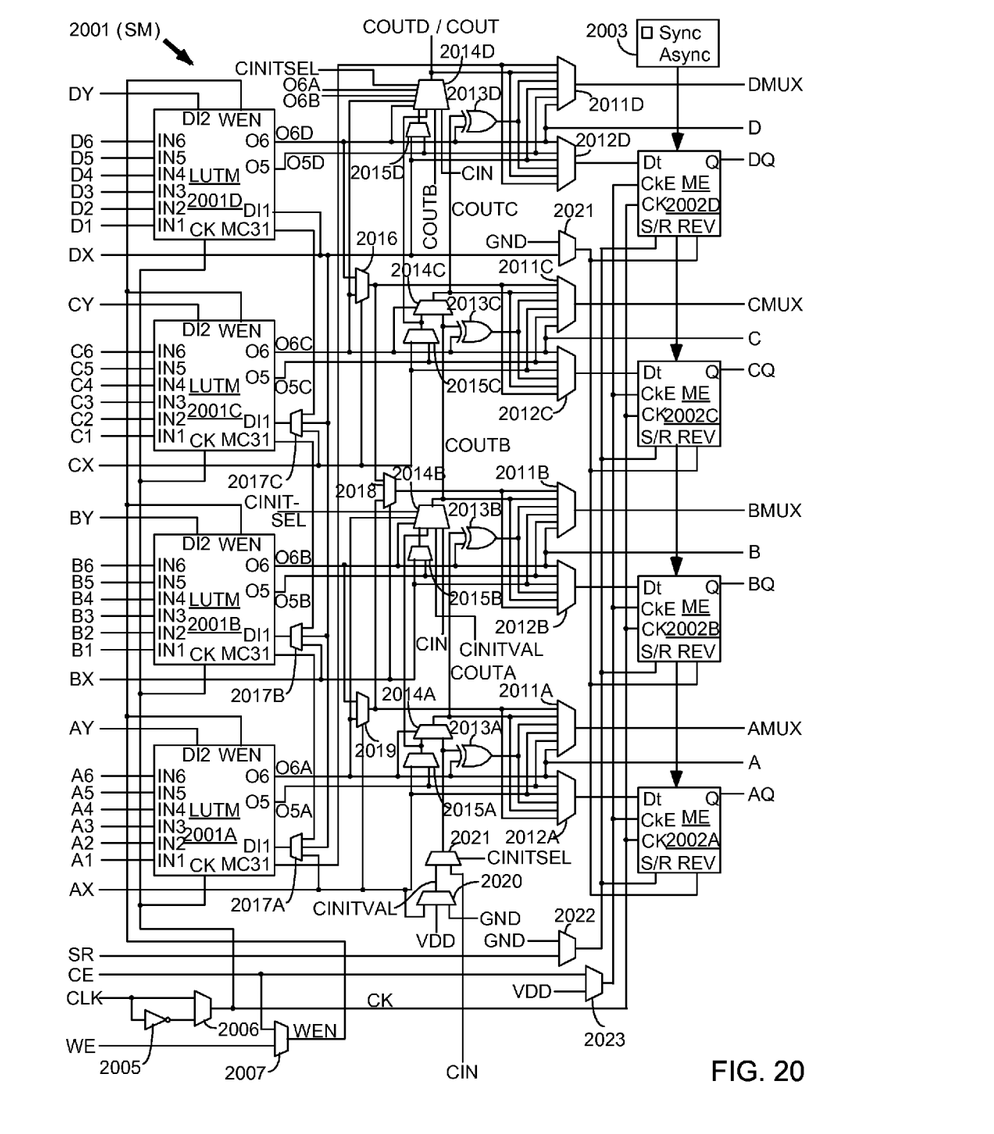
FIG. 20 is a block diagram of a configurable logic element of the integrated circuit of FIG. 19 according to an embodiment.

Turning now to FIG. 20, a block diagram of a configurable logic element of the integrated circuit of FIG. 19 is shown. In particular, FIG. 20 illustrates in simplified form a configurable logic element of a configuration logic block 1902 of FIG. 19. In the embodiment of FIG. 20, slice M 2001 includes four lookup tables (LUTMs) 2001A-2001D, each driven by six LUT data input terminals A1-A6, B1-B6, C1-C6, and D1-D6 and each providing two LUT output signals O5 and O6. The O6 output terminals from LUTs 2001A-2001D drive slice output terminals A-D, respectively. The LUT data input signals are supplied by the FPGA interconnect structure via input multiplexers, which may be implemented by programmable interconnect element 2011, and the LUT output signals are also supplied to the interconnect structure. Slice M also includes: output select multiplexers 2011A-2011D driving output terminals AMUX-DMUX; multiplexers 2012A-2012D driving the data input terminals of memory elements 2002A-2002D; combinational multiplexers 2016, 2018, and 2019; bounce multiplexer circuits 2022-2023; a circuit represented by inverter 2005 and multiplexer 2006 (which together provide an optional inversion on the input clock path); and carry logic having multiplexers 2014A-2014D, 2015A-2015D, 2020-2021 and exclusive OR gates 2013A-2013D. All of these elements are coupled together as shown in FIG. 20. Where select inputs are not shown for the multiplexers illustrated in FIG. 20, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 20 for clarity, as well as from other selected figures herein.

In the pictured embodiment, each memory element 2002A-2002D may be programmed to function as a synchronous or asynchronous flip-flop or latch. The selection between synchronous and asynchronous functionality is made for all four memory elements in a slice by programming Sync/Asynch multiplexer 2003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 2002A-2002D are clocked by a clock signal CK, which may be provided by a global clock network or by the interconnect structure, for example. Such programmable memory elements are well known in the art of FPGA design. Each memory element 2002A-2002D provides a registered output signal AQ-DQ to the interconnect structure. Because each LUT 2001A-2001D provides two output signals, O5 and O6, the LUT may be configured to function as two 5-input LUTs with five shared input signals (IN1-IN5), or as one 6-input LUT having input signals IN1-IN6.

In the embodiment of FIG. 20, each LUTM 2001A-2001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 2017A-2017C for LUTs 2001A-2001C), or to the two 32-bit RAMs via input terminals DI1 and DI2. RAM write operations in the LUT RAMs are controlled by clock signal CK from multiplexer 2006 and by write enable signal WEN from multiplexer 2007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 2001A may also be provided to the general interconnect structure for shift register chaining, via output select multiplexer 2011D and CLE output terminal DMUX. Accordingly, the circuits and methods set forth above may be implemented in a device such as the devices of FIGS. 19 and 20, or any other suitable device.

Figure 21:
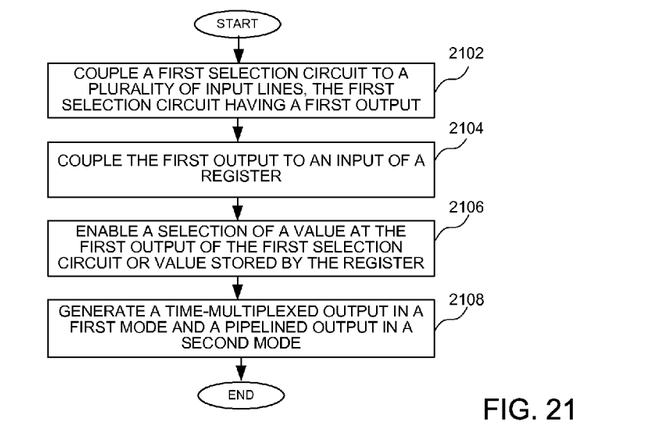
FIG. 21 is flow chart showing a method of implementing a multi-mode programmable interconnect element according to an embodiment.

Turning now to FIG. 21, a flow chart shows a method of implementing a multi-mode programmable interconnect element is shown. In particular, a first multiplexer is coupled to a plurality of input lines at a block 2102, wherein the first multiplexer has a first output. The first output is coupled to an input of a register at a block 2104. A selection of a value at the first output of the first multiplexer or a value stored by the register is enabled at a block 2106. The blocks 2102-2106 of the method of FIG. 21 may be implemented as described in reference to FIGS. 5-15. A time-multiplexed output is generated in a first mode and is generated in a pipelined output in a second mode at a block 2108. The block 2108 of the method of FIG. 21 may be implemented as described in reference to FIGS. 16-18.

Figure 22:
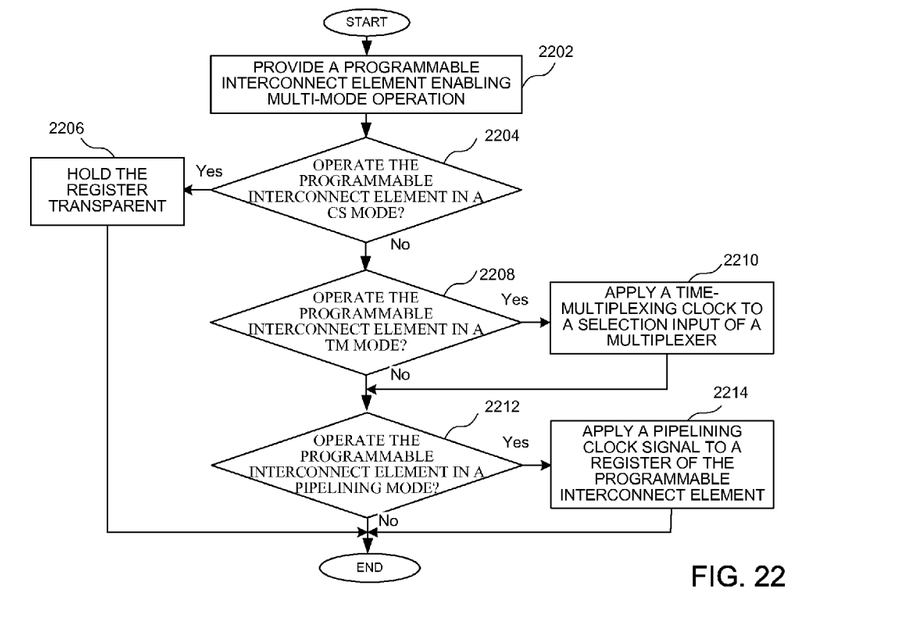
FIG. 22 is a flow chart showing a method of implementing a multi-mode programmable interconnect element according to an alternate embodiment.

Turning now to FIG. 22, a flow chart shows a method of implementing a multi-mode programmable interconnect element according to an alternate embodiment. A programmable interconnect element enabling multi-mode operation is provided at a block 2202. The programmable interconnect element enabling multi-mode operation could be implemented as shown in FIGS. 16-17, for example. It is determined if it is desired to operate the programmable interconnect element in a circuit-switched mode at a block 2204. If so, the register is held transparent block 2206. If not, it is then determined if it is desired to operate the programmable interconnect element in a time-multiplexing mode at a block 2208. If so, a time-multiplexing clock is applied to a selection input of a multiplexer at a block 2210. Because the multi-mode programmable interconnect elements of FIGS. 16-17 may also pipeline data which is time multiplexed (when serializing data as described above in reference to FIG. 16), it is then determined if it is desired to operate the programmable interconnect element in a pipelining mode at a block 2212. If so, a pipelining clock signal is applied to a register of the programmable interconnect element at a block 2214. If the input data is time multiplexed at block 2208 and pipelining is desired, the Sel_2 control signal controlling the multiplexer 1602 is the TM clock signal, and the clock signal applied as the control signal to the register 602 is a pipelining clock signal operating at a frequency of twice the TM clock signal as described above in reference to FIG. 16. The methods of FIGS. 21 and 22 could be implemented using the circuits of FIGS. 1-20 as described above, or any other suitable circuits.

It can therefore be appreciated that the new and novel programmable interconnect element and method of implementing a programmable interconnect element have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A programmable interconnect element for an integrated circuit device, the programmable interconnect element comprising:
 a first selection circuit comprising a first multiplexer coupled to a plurality of input lines and having a first output;
 a register having a first input coupled to the first output;
 a second selection circuit comprising a second multiplexer enabling the selection of a value at the first output or a value stored by the register; and
 a third multiplexer, wherein an output of the third multiplexer is coupled to an input of the second multiplexer.

2. The programmable interconnect element of claim 1, wherein the second multiplexer is coupled to receive both a registered output at an output of the register and an unregistered output at the first output of the first multiplexer.

3. The programmable interconnect element of claim 1, wherein the second multiplexer is coupled to the first output of the first multiplexer at a first input and is coupled to receive an input signal at a second input.

4. A programmable interconnect element of for an integrated circuit device, the programmable interconnect element comprising:
 a first selection circuit comprising a first multiplexer coupled to a plurality of input lines and having a first output;
 a register having a first input coupled to the first output; and
 a second selection circuit enabling the selection of a value at the first output or a value stored by the register, wherein the register comprises a latch and the second selection circuit comprises a signal generator, the latch being operable in a transparent state and a hold state in response to a control signal received at a second input.

5. A programmable interconnect element, the programmable interconnect element comprising:
 a first multiplexer having a plurality of input lines and a first output;
 a second multiplexer coupled to the plurality of input lines of the first multiplexer and having a second output;
 a third multiplexer having a first input coupled to the first output of the first multiplexer and a second input coupled the second output of the second multiplexer, and having a third output; and
 a first register having a first input coupled to the third output of the third multiplexer and a second input coupled to receive a first control signal,
 wherein a second control signal is provided to a control terminal of the third multiplexer in a time-multiplexing mode, and a third control signal is provided to the control terminal of the third multiplexer in a pipelining mode.

6. The programmable interconnect element of claim 5, wherein the control terminal of the third multiplexer is held fixed or allowed to float in the pipelining mode.

7. The programmable interconnect element of claim 5, wherein the control terminal of the third multiplexer is coupled to receive a first clock signal in the time-multiplexing mode.

8. The programmable interconnect element of claim 7, wherein the first control signal is the first clock signal.

9. The programmable interconnect element of claim 5, further comprising a fourth multiplexer coupled to an output of the first register, the fourth multiplexer enabling the selection of the third output of the third multiplexer or the output of the first register.

10. The programmable interconnect element of claim 9, further comprising a second register coupled to the output of the third multiplexer, wherein a first phase of a demultiplexed signal is stored in the first register and a second phase of the demultiplexed signal is stored in the second register.

11. The programmable interconnect element of claim 5, wherein an output of the programmable interconnect element is coupled to an input of another programmable interconnect element.

12. A method of implementing a programmable interconnect element, the method comprising:
 coupling a first multiplexer to a plurality of input lines, the first multiplexer having a first output;
 coupling the first output to an input of a register;
 enabling a selection of a value at the first output of the first multiplexer or a value stored by the register; and
 generating a time-multiplexed output of the programmable interconnect element in a first mode and a pipelined output of the programmable interconnect element in a second mode.

13. The method of claim 12, further comprising selecting a value at an input line of the plurality of input lines using the first multiplexer.

14. The method of claim 12, wherein enabling a selection of a value at the first output of the first multiplexer or a value stored by the register comprises coupling the first output of the first multiplexer and an output of the register to a multiplexer.

15. The method of claim 14, wherein enabling a selection of a value at the first output of the first multiplexer or a value stored by the register comprises operating the register as a transparent latch.

16. The method of claim 14, wherein enabling a selection of a value at the first output of the first multiplexer or a value stored by the register comprises controlling the register with a clock signal.

* * * * *